United States Patent [19]

Oh et al.

[11] Patent Number: 5,580,803
[45] Date of Patent: Dec. 3, 1996

[54] PRODUCTION METHOD FOR ION-IMPLANTED MESFET HAVING SELF-ALIGNED LIGHTLY DOPED DRAIN STRUCTURE AND T-TYPE GATE

[75] Inventors: Eung-Gie Oh; Jeon-Wook Yang; Chul-Soon Park, all of Daejeon, Rep. of Korea

[73] Assignee: Electronics and Telecommunications Research Institute, Daejeon-shi, Rep. of Korea

[21] Appl. No.: 566,709

[22] Filed: Dec. 4, 1995

[30] Foreign Application Priority Data

Oct. 28, 1995 [KR] Rep. of Korea ............... 95-36681

[51] Int. Cl.$^6$ .............................. H01L 21/265
[52] U.S. Cl. .................. 437/40; 437/44; 437/912
[58] Field of Search ............... 437/40–41, 44, 437/912, 39, 22, 36, 178–180, 126

[56] References Cited

U.S. PATENT DOCUMENTS

| | | | |
|---|---|---|---|
| 4,782,031 | 11/1988 | Hagio et al. | 437/39 |
| 4,889,827 | 12/1989 | Willer | 437/41 |
| 5,182,218 | 1/1993 | Fujihara | 437/22 |
| 5,185,278 | 2/1993 | Barker | 437/39 |
| 5,296,398 | 3/1994 | Noda | 437/44 |
| 5,496,779 | 3/1996 | Lee et al. | 437/40 |

OTHER PUBLICATIONS

Hagio, et al.: "A New Self–Align Technology For Low Noise GaAs Mesfet's–Sidewall–Assisted Pattern Inversion Technology–"; pp. 194–197; IEDM 1984.

Nakajima, et al.: "Manufacturability of Dummy–Gate Self–Aligned LDD GaAs Mesfets For High Volume Production"; pp. 119–122; GaAs IC Symposium, 1994.

Yamane, et al.: "0.1um GaAs Mesefet's Fabricated Using Ion–Implantation And Photo–Lithography"; pp. 185–188, GaAs IC Symposium 1993.

*Primary Examiner*—H. Jey Tsai
*Attorney, Agent, or Firm*—Larson and Taylor

[57] ABSTRACT

A production method for ion-implanted MESFET having self-aligned LDD structure and T-type gate, that the reverse mesa portion is formed at a predetermined part of the channel region which the source and drain regions are formed at both side by using caps layer, the ion is injected between the source and drain regions and the channel region as the small energy and low concentration by using the reverse mesa as the mask, the source and drain regions of the low concentration is formed so that drain part has more broadly than source part, and the gate electrode and the source and drain regions of the low concentration are not contacted at the formed groove which is removed the surface of the reverse mesa portion or the reverse mesa portion.

12 Claims, 5 Drawing Sheets

PRODUCTION METHOD FOR ION-IMPLANTED MESFET HAVING SELF-ALIGNED LIGHTLY DOPED DRAIN STRUCTURE AND T-TYPE GATE

FIELD OF THE INVENTION

The present invention relates to a production method for MESFET (Metal Semiconductor field Effect Transistor), and more particularly production method of MESFET including an ion-implanted and a self-aligned process and T-type gate forming process.

DESCRIPTION OF THE RELATED ART

In order to manufacture high performance receivers such as satellites or mobile communication devices, semiconductor elements such as MESFET, that operate quickly and have low noise factor and high gains, made of compound semiconductor such GaAs or InP, are required. In order to improve high frequency characteristic and low noise characteristic of MESFET, the improvement of a device performance become of major such as parasitic resistance and parasitic capacitance becoming of minimum, as well as a gate forming fine width of line less than 0.5 μm and moreover a breakdown voltage of drain becoming of maximum.

Furthermore, in order to obtain the high integration density and the high production, it is necessary that production method is simple and excellent in reproduction.

Recently, in order to improve characteristic of the MESFET, the LDD structure that doped an impurity of same conductivity type with a source and drain regions excepting portion of said channel region between the source and drain region, as low concentration has been used.

The production method the MESFET which has used the LDD structure is described in U.S. Pat. No. 5,182,218.

FIG. 1A to FIG. 1E are production process diagram of MESFET employing conventional LDD structure.

Figure 1A:
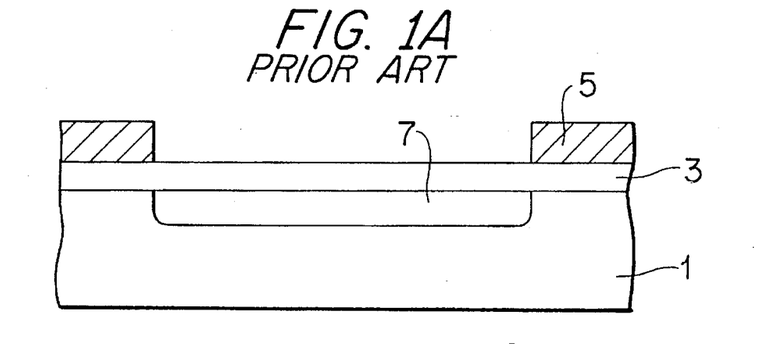
FIG. 1A to FIG. 1E are a sectional view of the field effect transistor according to the prior-art.

Referring to FIG. 1A, a surface protective layer 3 is formed by evaporating $SiO_2$ etc. on a surface of the semi-insulated semiconductor substrate 1 such as GaAs.

Then, a photosensitivity film 5 is applied on the top surface of the surface protective layer 3 and a predetermined part of the surface protective layer 3 is exposed by exposure and development.

Next, in order to form a channel region 7 on the predetermined top surface of the semiconductor substrate 1 at exposed part of the surface protective layer 3, N-type impurities such as a silicon is ion-implanted to an entire surface of the semiconductor substrate 1 by mean of ion injection method.

Figure 1B:
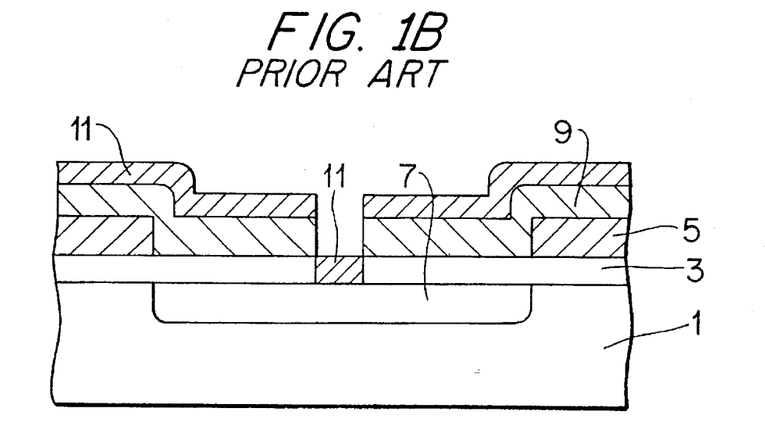

Referring to FIG. 1B, a photosensitivity film 9 is applied on an exposed part of the surface protective layer 3 and the top surface of the photosensitivity film 5.

Subsequently, a predetermined part of the photosensitivity film 9 is removed by a exposure and a development so that the surface protective layer 3 is exposed to outside, and the photosensitivity film 9 utilize means of etching mask to remove surface protective film, whereby only part of gate electrode in the channel region 7 is exposed.

Next, a gate electrode 11 is formed on a top surface of the channel region by means of evaporating as the sputtering refractory metals such as Tungsten, Molybdenum or Titanium or silicide of the refractory metal on a top surface of the photosensitivity film 9 and the channel region 7. In this time, the material layer 11 of the same gate electrode as the gate electrode 11 is evaporated on the top surface of the a second photosensitivity film 9, but is not evaporated on the side surface thereof.

Figure 1C:
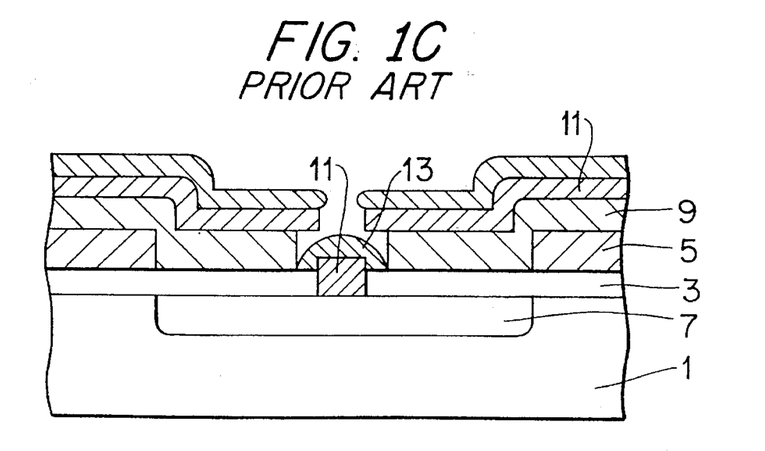

Referring to FIG. 1C, an exposed side surface of the photosensitivity film 9 is removed by a predetermined width by means of RIE (reactive ion etching), using the material layer 11 of the gate electrode as mask so that the photosensitivity film 9 is undercut.

Subsequently, a gate capping layer 13 is formed by sputtering $Si_3N_4$ or $SiO_2$ etc., using as the mask the material layer 11. In this time, the gate capping layer 13 is deposited the undercut part of the photosensitivity film 9, as well as to be deposited on the side surface of the gate electrode 11, and is deposited on the material layer 11 of the gate electrode as well.

Figure 1D:
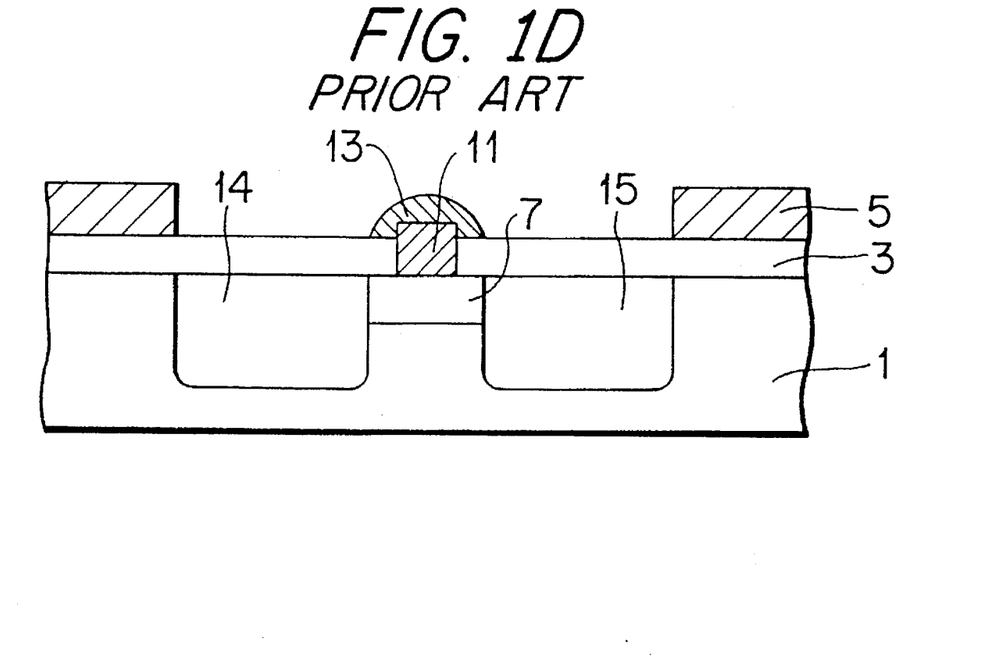

Referring to FIG. 1D, photosensitivity film 9 is removed by Acetone etc. In this time, the material layer 11 of the gate electrode formed on the top surface of the photosensitivity film 9 and the gate capping layer 13 are lift-off while the photosensitivity film 9 is removed. However, since photosensitivity film 5 is annealed twice, that is when forming the photosensitivity film and photosensitivity film 9 to have high hardness than the photosensitivity film 9, the photosensitivity film 5 remains without being removed. Source and drain regions 14, 15 are formed by ion injection method using Si of a high concentration without forming mask separately. In aforementioned process, Si is not injected into the photosensitivity film 5 and the semiconductor substrate 1 under the gate capping layer 13.

Figure 1E:
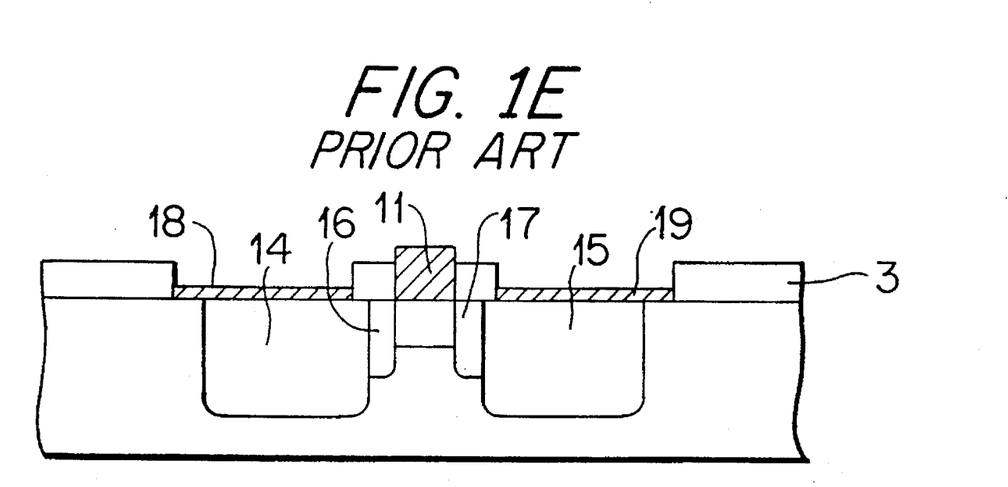

Referring to FIG. 1E, the gate capping layer 13 is removed by means of RIE process. Source and drain regions 16,17 of the low concentration are formed between the channel region 7 and the source and drain regions 14,15 by annealing to activate ions injected to them after ion-injecting Si of the low concentration without forming mask separately.

In aforemention process, Si is not injected into the lower part of the gate electrode 11 and the photosensitivity film 5. After removing the photosensitivity film 5, the surface protective layer 3 on the top part of source and the drain regions 14, 15 is removed by means of a typical photolithographic process. In aforementioned process, since the photosensitivity film 5 is annealed twice to be harden very hard, photosensitivity film 5 is not removed by Acetone etc. Thus, the photosensitivity film 5 is removed by ashing. Next, the source and drain electrodes 18,19 formed on the top surface of the exposed source and drain 14,15, whereby the MESFET is completed.

As the above-described, in the conventional production method of the MESFET, the width of the source and drain regions of the low concentration which is made LDD structure formed between both sides of gate electrodes and the source and drain regions is controlled, after forming the gate electrode so that the width of the gate capping layer which is formed on the top part of the gate electrode is defined by etching for the undercut of photosensitivity film of low part of gate materials However, in the conventional production method of the MESFET, since a degree of the undercut of photosensitivity film is formed in symmetry each other the gate electrode as center, there was a problem that when the drain region of the low concentration is broaden for the improvement of the breakdown voltage of the drain, the source region of the low concentration is broaden, the gate electrode is long and the cross-section region is small, so that the resistances of the source and gate are increased and the high frequency characteristic and noise characteristic of the device are reduced.

On the other hand, in the conventional production method of the MESFET, as the gate electrode and the source and drain regions of the low concentration are contacted, there was a problem that when the injected impurity is annealed for activating of the ions injected at high temperature, the gate electrode is expanded in the horizontal and the source and drain regions of the low concentration are extended, so that the leakage current is increased.

Furthermore, in the conventional production method of the MESFET, as a degree of the undercut which determined the size of the low concentration region is controlled by the RIE, there is a problem that the size of the low concentration region is changed by the unbalance of the etching by means of the RIE, therefore the characteristic of the device, particularly the parasitic resistance and the breakdown voltage of the drain are changed.

SUMMARY OF THE INVENTION

Accordingly, it is an object of the present invention to provide production method of the MESFET having LDD structure and T-type gate capable of reducing the source resistance, at the same time, improving the characteristic of the breakdown voltage of drain, reducing the gate resistance, improving the high frequency characteristic and noise characteristic, increasing the integrated density, and increasing the quantity of production.

It is another object of the present invention to provide production method of the MESFET capable of preventing increment of leakage current, so that the gate electrode and the source and drain regions of the low concentration are not contacted.

It is a further object of the present invention to provide a production method of the MESFET capable of preventing the short channel effect.

It is a still object of the present invention to provide production method of the MESFET for realizing fine linewidth gate, LDD structure and T-type by the same processing method to increase production quantity.

In order to achieve the above-mentioned objects, according to the first aspect of the present invention, there is provided production method of the MESFET comprising the steps of: forming a channel region of a predetermined conductivity type at the predetermined part of the compound semiconductor substrate of a semi-insulated; forming a source and drain regions having impurities of the same conductivity type as the channel region doped in high concentration at both sides excepting center portion of the channel region; forming a caps layer in the predetermined part on the channel region, and forming a reverse mesa having different separation each other with the source region and drain region on the channel region to wet-etching an exposed portion of the semiconductor substrate by using the caps layer as a mask; forming a source and drain of the low concentration of the same conductivity type as the source and drain regions between the channel region and the source and drain regions by using the caps layer as the mask; removing the caps layer, and forming protective film so as to expose a surface of the reverse mesa on the top part of the semiconductor substrate; removing the protective film to expose the source and drain region; and removing the reverse mesa, and forming the source and drain electrode; and forming T-type gate electrode at predetermined part.

In order to achieve the above-mentioned objects, according to the second aspect of the present invention, there is provided a production method of the MESFET comprising the steps of: forming a channel region of a predetermined conductivity type at the predetermined part of the compound semiconductor substrate of a semi-insulated; forming a source and drain regions having impurities of the same conductivity type as the channel region doped in high concentration at both sides excepting a center portion of the channel region; forming a gate electrode in the predetermined part on the channel region, and forming a reverse mesa part having different separation each other with the source region and drain region on the channel region to wet-etching an exposed portion of the semiconductor substrate by using the gate electrode as a mask; forming a source and drain of the low concentration of the same conductivity type as the source and drain regions by using the gate electrode as the mask; forming a protective film so as to exposure a surface of the gate electrode on the top part of the semiconductor substrate; removing the protective film to expose the source and drain regions, and forming the source and drain electrode; and forming the T-type gate electrode by evaporating conductivity type metal on the top part of the gate electrode.

Other and further objects, features and advantages of the invention will appear more fully from the following description.

DETAILED DESCRIPTION OF THE PREFERRED EMBODIMENTS

Hereinafter, the embodiment of the present invention will be concretely described with reference to the accompanying drawings.

FIG. 2A to FIG. 2F are the production process diagram of the MESFET according to one embodiment of the present invention.

Figure 2A:
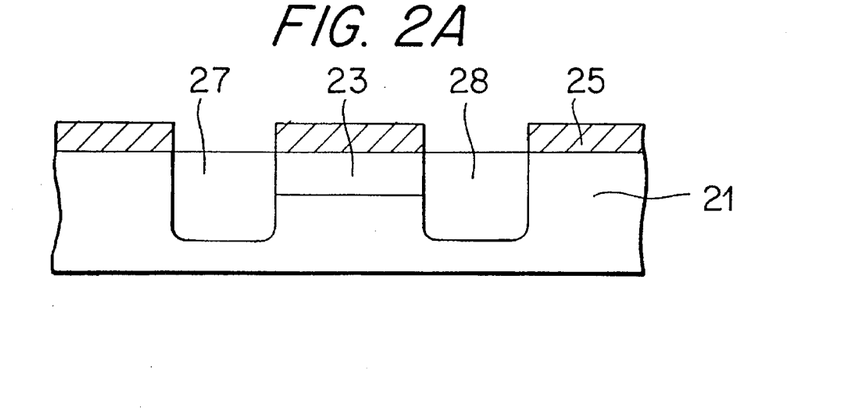
FIG. 2A to FIG. 2F are a sectional view of the field effect transistor according to one embodiment of the present invention.

Referring to FIG. 2A, a photosensitivity film (not shown) is applied on semiconductor substrate 21 of the semi-insulated such as GaAs having (100) direction, a predetermined part of the semiconductor substrate 21 is exposed by means of exposure and development.

Next, such as silicon is ion-implanted to the exposed part of the semiconductor substrate 21, so that a channel region 23 of N-type is formed.

In this time, a part of the semiconductor substrate 21 to which the photosensitivity film is applied, is not Si ion-implanted by the photosensitivity film.

Next, the photosensitivity film is removed by ashing. Subsequently, the photosensitivity film 25 is applied on the semiconductor substrate 21, so that a part of both side which is excepted a center portion of the channel region 23, is exposed by means of exposure and development.

Next, impurities such as Si is ion-implanted to the exposed part of the channel region 23 as the high concentration and a higher energy than that of the channel region 23, and the exposed part is annealed, whereby a source and drain regions 27,28 of N-type are found.

In the above-mentioned method, the channel region 23 is formed by means of the ion-implanted, but that may be formed by means of the crystal growth method.

Furthermore, the channel region 23 and the source and drain regions 27,28 are formed by N-type impurities such as Si, but that may be formed by P-type impurities such as Be or Mg.

Figure 2B:
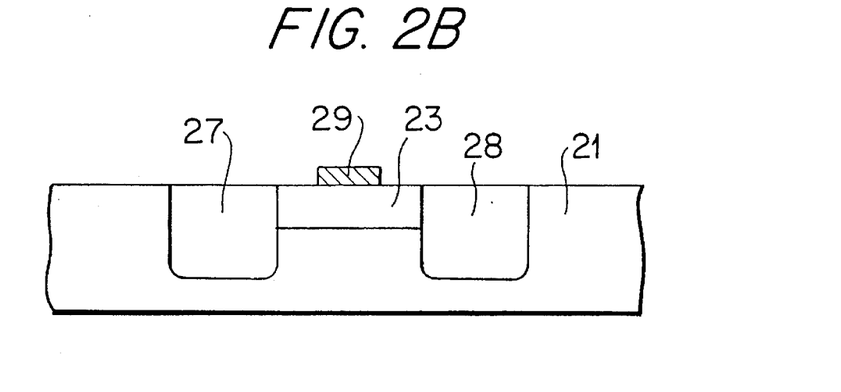

Referring to FIG. 2B, the photosensitivity film 25 is removed by ashing. Next, refractory metals such as Tungsten, Molybdenum or Titanium, compounds of the refractory metals such as Tungsten Nitride or Silicides of the refractory metals are vacuum evaporated or sputtered on the whole substrate, so that a caps layer 29 is formed on the surface of semiconductor substrate 21.

Subsequently, a resist pattern (not shown) only which covered a predetermined part of the channel region 23 to be formed the gate electrode is formed in a typical photolithographic process, before the caps layer 29 of the remainder part excepted a predetermined part of the channel region 23 is removed by using the resist pattern as the mask.

Figure 2C:
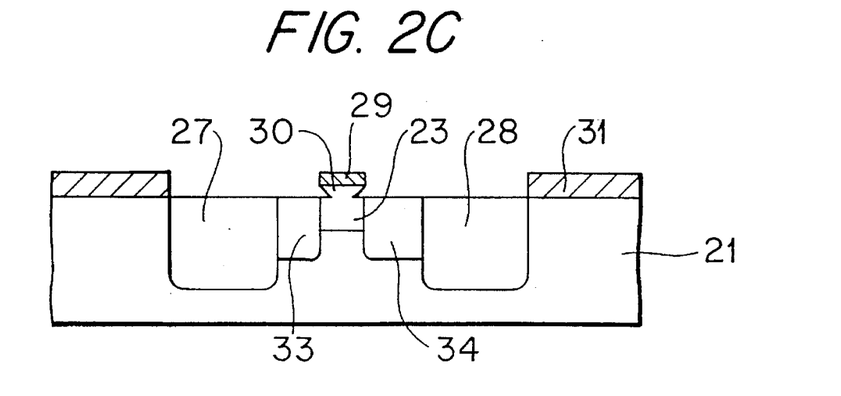

Referring the FIG. 2C, the surface of semiconductor substrate 21 is wet-etched by using the caps layer as the mask, so that a reverse mesa is formed on the channel region 23.

In the above statements, wet-etching shape of GaAs used to the semiconductor substrate 21 is different from each other according to the crystal direction, for example, (0 11) direction of the major flat direction is represented the etching shape of the reverse mesa, and (0 11) direction of the minor flat direction is represented the etching shape of the mesa.

Thus, the caps layer 29 on the channel region 23 must be formed to the major flat direction of the semiconductor substrate 21.

Furthermore, when etching a portion of the reverse mesa portion, solution composed of $H_3PO_4:H_2O_2:H_2O$ at ratio of 4:1:50 is used as the etchant, the etching rate is substantially 900 Å/min and the etching angle is substantially 60°.

The separation of the gate electrode (not shown) and the source and drain regions (not shown) of the low concentration that to be formed later, is determined in accordance with a degree and angle of the etching of the reverse mesa 30.

Next, the photosensitivity film 31 is formed at portion which is excepted from the channel region 23 and the source and drain regions 27,28 of the semiconductor substrate 21.

Subsequently, Si is ion-implanted as the low concentration and a smaller energy than that of the source and drain regions 27, 28 by using the caps layer 29 and the photosensitivity film 31 as the mask, it is annealed, and the source and drain regions 33, 34 of the low concentration are formed between the channel region 23 and the source and drain regions 27, 28, thereby LDD structure is made.

In this time, Si is not injected at lower part of the photosensitivity film 31 and the caps layer 29, the size of the source and drain regions 27,28 of the low concentration are controlled by the separation of the caps layer 29 and the source and drain regions 27,28, respectively. In the above-mention, the separation of the drain region 28 is a larger that of the source region 27, so that the size of the drain region 34 of the low concentration is formed broadly more than the source region 34 of the low concentration.

Figure 2D:
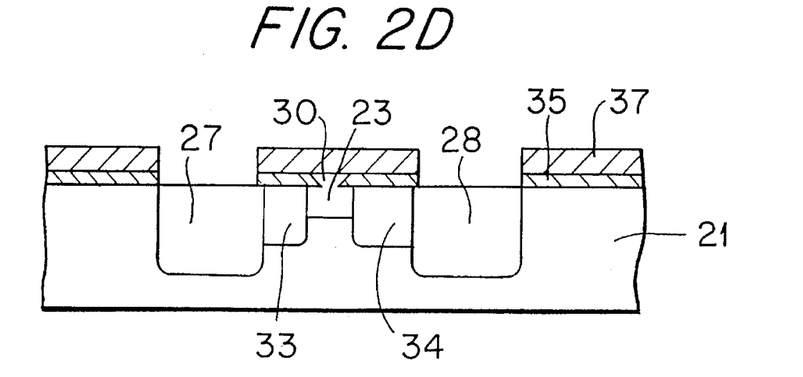

Referring to FIG. 2D, the photosensitivity film 31 is removed by means of the ashing process. A pad layer (not shown) is formed on the surface of the semiconductor substrate 21 by evaporating such as $Si_3N_4$ or $SiO_2$, thus ion of the impurity by injecting such as a rapid thermal annealing is activated.

Next, the caps layer 29 and pad layer is removed by means of the process, again $Si_3N_4$ or $SiO_2$ is evaporated on the surface of the semiconductor substrate 21, thus a flat protective film 35 which is flatted a surface is formed so as to expose the surface of reverse mesa portion 30.

Subsequently the photosensitivity film 37 is formed on the reverse mesa 30 and protective film 35 so as to expose the protective film 35 of the top part of the source and drain regions 27,28.

Next, the protective film 35 of the part which is not formed the photosensitivity film 37 is removed, so that the source and drain region 27, 28 are exposed.

Figure 2E:
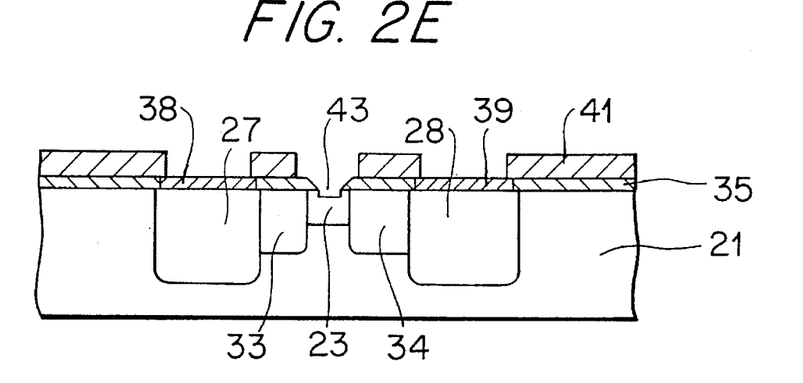

Referring to FIG. 2E, the ohmic metal such as AuGe/Li/Au is evaporated on the surface of the exposed source and drain regions 27, 28, so that the source and drain regions 38, 39 is formed. In this time, the ohmic metal is evaporated on the top part of the photosensitivity film 37 as well.

Next, the photosensitivity film 37 is removed, at the same time, the ohmic metals evaporated on the photosensitivity film 37 are lift-off and removed as well, and a metals of the source and drain electrodes is annealed for the sintering.

Subsequently, the photosensitivity film 41 is applied on the protective film 35 and the source and drain regions 38, 39. Next, the photosensitivity film 41 is exposed and developed, and the reverse mesa portion 30 which in the top part of the source and drain electrodes 38, 39 and the channel region 23 is exposed.

The exposed reverse mesa portion 30 is formed a groove 43 by means of the recess etching, so as to remove the channel region 23 by a predetermined depth, by using the source and drain regions 38, 39 and the photosensitivity film 41 as the mask.

Figure 2F:
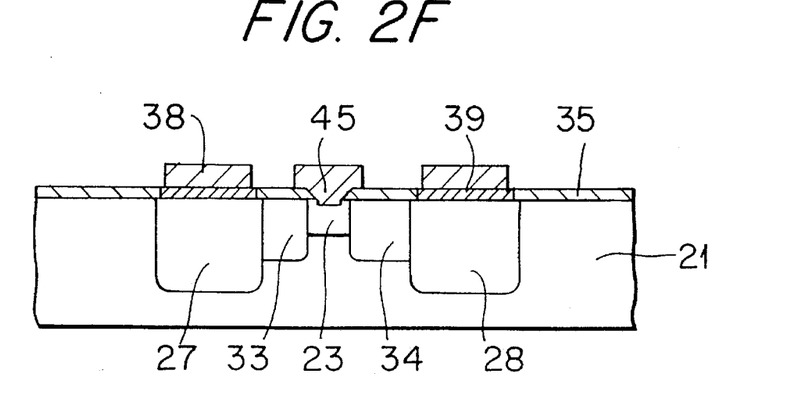

Referring to FIG. 2F, a conductivity metals such as Au is evaporated into the groove 43, so that T-type gate electrode 45 is formed. In this time, the conductivity metals is evaporated on the top portion of the photosensitivity film 41 and the source and drain electrodes 38, 39 as well.

Next, the photosensitivity film 41 is removed for completing MESFET, while the ohmic metal evaporated on the top part of the photosensitivity film 41 is lift-off and remove as well. The conductivity metals evaporated on the top part of the source of drain 38, 39 is not removed, and used together with source and drain electrodes 38,39.

Figure 3A:
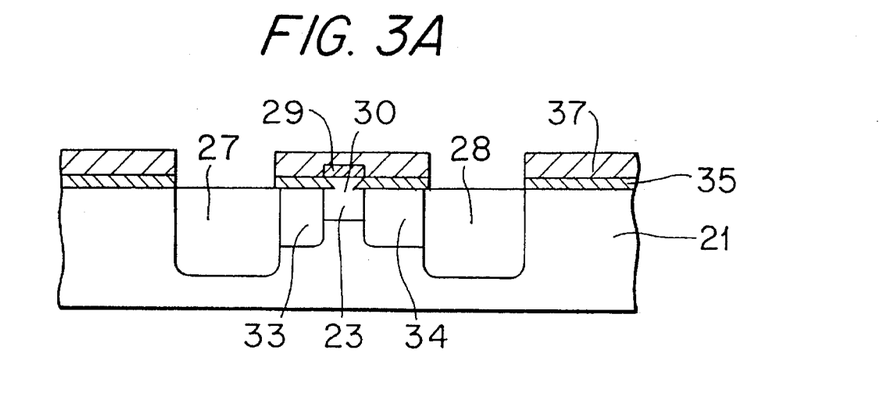
FIG. 3A to FIG. 3C are a sectional view of the field effect transistor according to the other embodiment of the present invention.
Figure 3B:
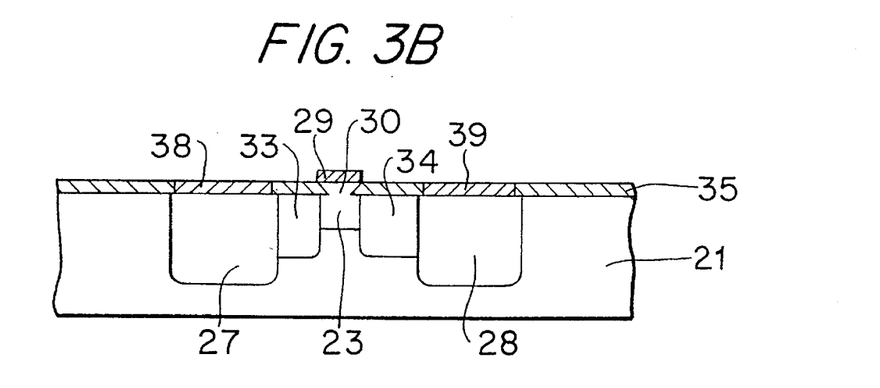
Figure 3C:
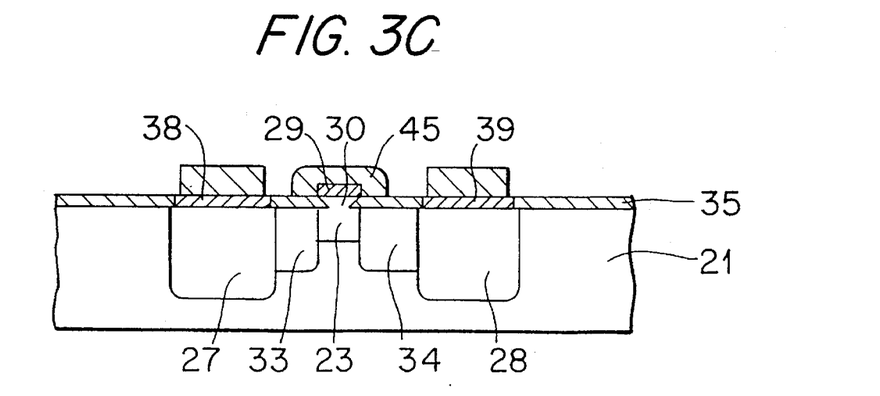

FIG. 3A to FIG. 3C are the process diagram of the MESFET according to the other embodiment of the present invention.

In this embodiment, the above-mentioned the caps layer 20 of the one embodiment of the present invention become to a gate electrode.

Referring to FIG. 3A, after the process of the FIG. 2A to FIG. 2C is carried, the photosensitivity film 31 is removed by means of the ashing. Such as $Si_3N_4$ or $SiO_2$ is evaporated on the surface of the semiconductor substrate 21, a ion-implanted impurities is activated by means of the rapid thermal annealing etc., thus a flat protective film 35 which is flatted a surface is formed so as to expose the surface of the caps layer 29. Next, after the photosensitivity film 37 is applied on the top surface of the reverse mesa portion 30 and the protective film 35, the surface of source and drain regions 27, 28 is exposed by means of the typical photolithographic process.

Referring to FIG. 3B, the ohmic metal such as AuGe/Li/Au is evaporated on the surface of the exposed source and drain regions 27, 28, so that the source and drain regions 38, 39 is formed. In this time, the ohmic metal is evaporated on the top part of the photosensitivity film 37 as well.

Next, the photosensitivity film 37 is removed, when forming the source and drain electrodes 27, 28 evaporated on the photosensitivity film-37, the ohmic metals evaporated on the photosensitivity film 37 are lift-off and removed as well. In this time, the gate electrode 29 formed on the top part of the reverse mesa portion 29 as well. Next, a metals of the source and drain electrodes is annealed for the sintering.

Referring to FIG. 3C, the photosensitivity film is applied on the top part of the gate electrode 29, protective film 35 and the source and drain electrodes 38, 39, respectively. Subsequently, the photosensitivity film is exposed and developed, so that the source and drain electrodes 38, 39 and the gate electrode 29 is exposed.

A conductivity metals such as Au is evaporated into the whole surface of the above-mentioned structure, so that T-type gate electrode 45 is formed. In this time, the conductivity metals is evaporated on the top part of the photosensitivity film 41 and the source and drain electrodes 38, 39 as well.

Next, the photosensitivity film 41 is removed for completing MESFET, while the ohmic metal evaporated on the top part of the photosensitivity film 41 is lift-off and removed as well. The conductivity metals evaporated on the top portion of the source and drain regions 38,39 is not removed, and used together with source and drain electrodes 38,39.

As described above, the following function and advantages can be obtained from this invention.

In the production method of MESFET according to the present invention, the reverse mesa portion is formed at predetermined part of the channel region which the source and drain regions is formed at both side by using caps layer, the ion is injected between the source and drain regions and the channel region as the small energy and low concentration by using the reverse mesa as the mask, the source and drain regions of the low concentration is formed so that drain part has more broadly than source part, and the gate electrode and the source and drain regions of the low concentration is not contacted at the formed groove which is removed the surface of the reverse mesa portion or the reverse mesa portion.

Thus, according to the present invention, since the drain region is a broad,so that the breakdown voltage of drain is improved, and since the gate resistance is reduced by the T-type gate electrode, so that this invention can be improved the high frequency characteristic and the noise characteristic of a device.

Further, since the gate electrode and the source and drain regions of the low concentration is not contacted, so that this inventions can be prevented the generation of the leakage current.

Further, since the thickness of channel layer is controlled in accordance with the degree of etching when forming reverse mesa portion, so that this invention can be reduced the short channel effect.

It is further understood by those skilled in the art that the foregoing description is a preferred embodiment of the disclosed device and that various changes and modification may be made in the invention without departing from the spirit and scope thereof.

What is claimed is:

1. Production method for ion-implanted MESFET (Metal Semiconductor Field Effect Transistor) having self-aligned LDD structure and T-gate, said method comprising the steps of:

forming a channel region of a first conductivity type at a part of a semi-insulated compound semiconductor substrate;

forming source and drain regions at both ends of said channel region having an impurity of the same conductivity type as said channel region at a higher doping concentration than at a center portion of said channel region;

forming a caps layer on a first part of said channel region, and forming a reverse mesa having different separation between said reverse mesa and, respectively, said source region and drain region on said channel region by wet-etching an exposed portion of said semiconductor substrate by using the caps layer as a mask, said reverse mesa having a bottom width smaller than a top width;

forming a source and a drain having a lower doping concentration of the same conductivity type than said source and drain regions between said channel region and respective said source and drain regions by using said caps layer as the mask;

removing said caps layer, and forming a protective film so as to expose an upper surface of the reverse mesa on a top part of said semiconductor substrate;

removing said protective film to expose said source and drain regions and forming source and drain electrodes; and removing said reverse mesa, and forming a T-shape gate electrode at said first part of said channel region.

2. Production method for ion-implanted MESFET having self-aligned LDD structure and T-gate according to claim 1, wherein said channel region is formed by an ion-implanted method or epitaxial method.

3. Production method for ion-implanted MESFET having self-aligned LDD structure and T-gate according to claim 2, wherein said channel region is formed by doping N-type or P-type conductivity.

4. Production method for ion-implanted MESFET having self-aligned LDD structure and T-gate according to claim 3, wherein said N-type doping is Si.

5. Production method for ion-implanted MESFET having self-aligned LDD structure and T-gate according to claim 3, wherein said P-type doping is Be or Mg.

6. Production method for ion-implanted MESFET having self-aligned LDD structure and T-gate according to claim 1, wherein said caps layer is formed by one of refractory metals, compounds of refractory metals, or silicides of the refractory metals.

7. Production method for ion-implanted MESFET having self-aligned LDD structure and T-gate according to claim 6, wherein said caps layer is formed by a sputtering method or a vacuum evaporation method.

8. Production method for ion-implanted MESFET having self-aligned LDD structure and T-gate according to claim 1, wherein said reverse mesa is formed so that the drain region has a larger separation than that of the source region.

9. Production method for ion-implanted MESFET having self-aligned LDD structure and T-gate according to claim 8, wherein said reverse mesa is formed by wet-etching with solution composed of $H_3PO_4:H_2O_2:H_2O$ at ratio of 4:1:50.

10. Production method for ion-implanted MESFET having self-aligned LDD structure and T-gate according to claim 8, wherein said reverse mesa is formed substantially at an angle 60°.

11. Production method for ion-implanted MESFET having self-aligned LDD structure and T-gate according to claim 1, wherein a groove is formed in said channel region and said protective film after removing said reverse mesa.

12. Production method for ion-implanted MESFET having self-aligned LDD structure and T-gate according to claim 11, wherein a gate electrode is formed in the groove and on the protective film.

* * * * *